United States Patent [19]

Senda et al.

[11] Patent Number: 4,508,756
[45] Date of Patent: Apr. 2, 1985

[54] METHOD FOR INHIBITING OXIDATION OF A COPPER FILM ON CERAMIC BODY

[75] Inventors: Atsuo Senda, Ootsu; Tohru Kasanami, Otokuni; Takuji Nakagawa, Kyoto, all of Japan

[73] Assignee: Murata Manufacturing Co., Ltd., Japan

[21] Appl. No.: 389,251

[22] Filed: Jun. 17, 1982

Related U.S. Application Data

[63] Continuation of Ser. No. 194,984, Oct. 8, 1980, abandoned.

[51] Int. Cl.³ .................. B05D 1/18; C23C 3/02; C23C 13/02
[52] U.S. Cl. .................. 427/81; 427/79; 427/123; 427/250; 427/255; 427/335; 427/377; 427/443.1; 427/444; 148/1; 148/13.2; 148/6.14 R; 148/6.31; 422/1; 422/40; 252/388; 204/192 SP; 204/192 N
[58] Field of Search .................. 427/79, 80, 123, 335, 427/377, 444, 81, 443.1, 250, 255; 148/6.14 R, 6.31, 1, 13.2; 422/1, 40; 252/388; 204/192 SP, 192 N

[56] References Cited

U.S. PATENT DOCUMENTS

| | | | |
|---|---|---|---|
| 2,298,513 | 10/1942 | Rodgers | 427/435 |
| 2,349,183 | 5/1944 | Mahler | 422/40 |
| 2,845,366 | 7/1958 | Schroeder | 427/377 |
| 2,972,570 | 2/1961 | Haas et al. | 427/80 |
| 2,978,098 | 4/1961 | Post | 427/79 |
| 3,015,576 | 1/1962 | Hendrixson et al. | 427/335 |
| 3,034,921 | 5/1962 | Thompson | 427/79 |
| 3,035,944 | 5/1962 | Sher | 427/79 |
| 3,073,721 | 1/1963 | Pokorny | 427/335 |
| 3,254,282 | 5/1966 | West | 427/79 |
| 3,416,207 | 12/1966 | Maida | 427/79 |
| 3,531,414 | 9/1970 | Randell et al. | 148/6.31 |
| 3,941,720 | 3/1976 | Hoffmann et al. | 502/301 |
| 4,123,562 | 10/1978 | Chandross et al. | 148/6.14 |

OTHER PUBLICATIONS

Grunwald et al., Some Physical Properties of Electroless Copper Plating, 58, 1004, Oct. 1971.

*Primary Examiner*—Richard Bueker
*Attorney, Agent, or Firm*—Ostrolenk, Faber, Gerb & Soffen

[57] ABSTRACT

A method for inhibiting oxidation of copper electrodes of a ceramic capacitor, comprising the step of subjecting copper films formed by an electroless plating process or the like and serving as opposed electrodes of a ceramic capacitor to a hydrocarbon halide compound including trichloroethylene, perchloroethylene, freon, chlorobenzene, methyl chloride, methylene chloride, chloroform, carbon tetrachloride, or the like.

8 Claims, 6 Drawing Figures

METHOD FOR INHIBITING OXIDATION OF A COPPER FILM ON CERAMIC BODY

This is a continuation of application Ser. No. 194,984, filed Oct. 8, 1980, and now abandoned.

BACKGROUND OF THE INVENTION

1. Field of the Invention

The present invention relates to a method for inhibiting oxidation of a copper film on a ceramic body. More specifically, the present invention relates to a method for inhibiting oxidation of a copper film formed as an electrode or a conductive device on a ceramic electric circuit component including a ceramic body.

2. Description of the Prior Art

One example of a ceramic electric circuit component of interest to the present invention is a ceramic capacitor. The electrode of a ceramic capacitor was generally formed using silver of high conductivity. Such a silver electrode was formed by coating a silver paste on a ceramic body and by baking the same. However, with the recent rise of the cost of silver materials, the ratio of the cost of such silver electrode to the total cost of a ceramic capacitor has increased. Thus, employment of such a silver electrode became a cause of the rise of the total cost of ceramic capacitors.

In such situation, an attention was given to development of an inexpensive electrode. As one approach, various studies were made as to a method for forming a metallic film by various processes, such as electroless plating process, vacuum evaporation process, sputtering process, ion plating process, and the like. As another approach, study was made as to employment of an inexpensive metal in substitution for the silver as an electrode.

The first approach employed was a nickel plated electrode formed by means of an electroless plating process. A nickel plated electrode was successful to some extent as an inexpensive electrode in substitution for a silver electrode. However, it was observed that employment of a nickel plated electrode as an electrode of ceramic capacitors involves the following problems. More specifically, the resistivity of a nickel electrode per se is $7.24 \times 10^{-6}$ $\Omega$.cm, which is higher than that of silver which is $1.62 \times 10^{-6}$ $\Omega$.cm. Accordingly, the frequency characteristic is degraded in the high frequency region. Another problem is that solderability of a nickel plated electrode is poor. Furthermore, another approach attempted that the whole surface is coated with a solder layer in order to decrease the resistivity of the nickel plated electrode. However, in coating the whole surface of the electrode with a solder layer, a large amount of flux which is active must be used. Accordingly, it is necessary to cleanse the electrode to remove unnecessary flux after soldering. Furthermore, although soldering the electrode portion is by dipping the same in a solder tub, for example, such process cause stress in the ceramics, so that a crack is liable to be caused in the ceramics.

Development of an inexpensive and high conductive electrode which can be substituted for the above described nickel electrode was clearly desired. Under the circumstances, a copper plated electrode made by means of a copper electroless plating process was attemped. However, it was observed that a serious obstacle is involved in a copper electroless plated electrode. More specifically, a copper plated electrode formed by an electroless plating process as such was liable to be oxidized and had a large resistivity as compared with that of a bulk of copper. A similar phenomenon was also observed in a copper electrode formed by a vacuum evaporation process, a sputtering process, an ion plating process and the like as well as a copper electrode formed by an electroless plating process.

The above described property of greater liability to be oxidized results in disadvantages. For example, when a copper film is used as an electrode of a ceramic capacitor, an unfavorable phenomenon is observed in which the conductivity of the electrode is decreased due to formation of an oxide film as a result of oxidation, which accordingly decreases solderability.

With regard to the fact that a copper film formed by the above described various processes has a large resistivity as compared with that of a bulk of copper, the copper film requires some additional treatment to exhibit a characteristic of a copper bulk by achieving metallization, dense formation, enhancement of adhesiveness and stabilization. Usually, heat treating is employed to that end. Generally, heat treatment is performed in an inert atmosphere so that the copper film is not reacted with oxygen. By subjecting the copper electrode to a heat treating process, a copper film formed by an electroless plating process, a vacuum evaporation process, a sputtering process, an ion plating process, and the like becomes for the first time a copper film exhibiting an electric characteristic close to that of pure copper and accordingly, a ceramic electric circuit component such as a ceramic capacitor of high reliability can be realized.

However, by subjecting a copper film to the heat treating process, the copper film comes to exhibit a property of greater liability to be oxidized as compared with a copper film not heat treated and of greater liability to a time dependent characteristic change. This is presumably due to the fact that a catalytic activity is provided to the copper film surface, thereby making it more liable to be oxidized.

Accordingly, a copper film is more or less liable to be oxidized irrespective of heat treatment and in any case, some oxidization inhibiting process is required to a copper film. Furthermore, a copper film after heat treatment particularly requires an oxidization inhibiting process.

SUMMARY OF THE INVENTION

In brief, the present invention is applied to a ceramic body having a copper film formed on the surface thereof and is characterized by subjecting the copper film to a hydrocarbon halide compound. According to the present invention, the oxidizing phenomenon of the surface of the copper film is not observed and solderability is excellent and thus inhibition of oxization of a copper film is advantageously achieved.

In a preferred embodiment of the present invention, as a hydrocarbon halide compound, trichloroethylene, perchloroethylene, freon, chlorobenzene, methyl chloride, methylene chloride, chloroform, carbon tetrachloride or the like is used.

In a further preferred embodiment of the present invention, of hydrocarbon halide compound having surface active agent dissolved therein is used.

In still a further preferred embodiment of the present invention, a hydrocarbon halide compound having fatty acid such as stearic acid, or higher fatty acid ester such as wax dissolved therein is used.

In still another preferred embodiment of the present invention, a hydrocarbon halide compound having high molecular compound dissolved is used.

Accordingly, a principal object of the present invention is to provide a process for inhibiting oxization of a copper film formed on a ceramic body.

Another object of the present invention is to achieve high reliability of a copper film used as an electrode of a ceramic electric circuit component including a ceramic body.

A further object of the present invention is to inhibit oxization of, thereby to stabilize, a copper film after heat treatment which has been given catalytic activity and then made liable to be oxidized.

Still a further object of the present invention is to enable long period preservation of a copper film.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
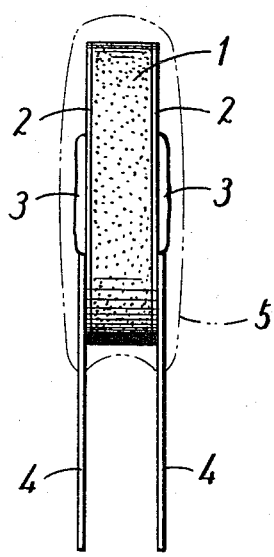
FIG. 1 is a side view of a ceramic capacitor by way of an example of a ceramic electric circuit component including a ceramic body.

An outline of the preferred embodiment of the present invention will be generally described. At the outset, a ceramic body of such as a dielectric, insulating, resistive, semiconductive or the like material is prepared. Then a copper film is formed on the surface of the ceramic body by means of thin film forming technology such as an electroless plating process, a vacuum evaporation process, a sputtering process, an ion plating process or the like. By employing dielectric ceramics as a ceramic body and by forming a copper film on the surface thereof, a capacitor is constituted. By employing ceramics of such as alumina, zirconia, forsterite, or the like as a ceramic body and by forming a circuit pattern of a copper film on the surface thereof, a circuit board is constituted. Besides, by forming a copper film on the surface of a ceramic body such as a resistive, semiconductive or the like material, various kinds of electronic components are constituted.

It is preferable that the inventive method should be applied as soon as possible to every copper film formed by any one of such processes as an electroless plating process, a vacuum evaporation process, a sputtering process, an ion plating process and the like, since the copper film thus obtained is in any event liable to be oxidized. In addition, by subjection to heat treatment, the copper film comes to exhibit a property or greater liability to be oxidized as compared with that not heat treated. More specifically, various kinds of electronic components including copper films formed on the surface of ceramic bodies by means of various processes are then subjected to a heat treatment process at the temperature of approximately 700° C. in an inert atmosphere such as nitrogen. The copper film as heat treated has been metallized and exhibits a strong adhesiveness and enhanced electric characteristic, thus having a very preferred characteristic. However, due to the fact that the copper film undergoes thermal hysteresis of a high temperature by heat treatment, catalytic activity is also afforded to the copper film to become a very active copper film having the same catalytic power as that of Raney copper.

The copper film having such catalytic activity afforded is caused to undergo as soon as possible a process for subjecting the same to hydrocarbon halide compound which is a feature of the present invention. More specifically, the shorter the time period after the heat treatment of the copper film until the film being subjected to hydrocarbon halide compound, the better. If feasible, preferably the copper film should be subjected to hydrocarbon halide compound within 30 minutes after the heat treatment. According to such hydrocarbon halide compound subjecting process, the active site of the copper film is lost due to a poisoning effect of the hydrocarbon halide compound, whereby the catalytic activity is lost, with the result that the copper film becomes stable and is difficult to be oxidized.

As the hydrocarbon halide compound, preferably at least one member selected from the group consisting of trichloroethylene, perchloroethylene, freon, chlorobenzene, methyl chloride, methylene chloride, chloroform, and carbon tetrachloride is used. As a process for subjecting the heat treated copper film to such hydrocarbon halide compound, a process of coating the hydrocarbon halide compound, spraying the compound, dipping the film in the compound, subjecting the film to a vapor of the compound, or the like is used.

In another preferred embodiment of the present invention, a solution of the hydrocarbon halide compound having a surface active agent dissolved therein is used in the process for subjecting the film to the hydrocarbon halide compound. As a possible surface active agent, an anionic surface active agent of such as naphthenic acid soap, a cationic surface active agent of such as alkyloxazoline, a nonionic surface active agent of such as ester of polyethylene glycol, an amphoteric surface active agent of such as ester of taurine condensed succinic acid, or the like may be used. More specifically, insofar as such is a surface active agent which is dissoluble in hydrocarbon halide compound, any type of surface active agent may be used. Accordingly, it is pointed out that the kind of surface active agent is not limited to the above described examples. For the purpose of subjecting the copper film as heat treated to a solution of hydrocarbon halide compound having such surface active agent dissolved, a process of coating the solution, spraying the solution, dipping the film in the solution or the like may be employed. By employing the process of subjecting the film to the hydrocarborn halide compound including a surface active agent, a monomolecular layer of the surface active agent is formed on the surface of the copper film, and as a result, the effect of inhibiting oxidation of the copper film and of preventing a time dependent change of the film becomes more conspicuous, as compared with a case where the hydrocarbon halide compound does not include a surface active agent.

In a further preferred embodiment of the present invention, a solution of hydrocarbon halide compound with fatty acid such as stearic acid or higher fatty acid ester such as wax dissolved therein is used in the process of subjecting the copper film to the hydrocarbon halide compound. As utilizable fatty acid or fatty acid ester, fatty acids such as palmitic acid, lanolic acid and the like and fatty acid esters may be enumerated, besides the above described stearic acid and wax. According to the preferred embodiment being described, as in the case of the embodiment employing surface active agent as described above, a monomolecular layer of fatty acid or fatty acid ester is formed on the surface of the copper film, whereby oxidization and time dependent change of the copper film is much more inhibited. Fatty acid or fatty acid ester being used in the embodiment is selected from the above described viewpoint and any one of the fatty acid group or fatty acid ester group may be used insofar as such is likely to form a monomolecular layer on the surface of the copper film. The subjecting process of the embodiment in description may be carried out by a process of coating the solution of hydrocarbon halide compound having fatty acid or fatty acid ester dissolved therein, a process of spraying the above described solution, a process of dipping the copper film in the solution or the like.

In still a further preferred embodiment of the present invention, the process of subjecting the copper film to the hydrocarbon halide compound may be carried out using a solution of the hydrocarbon halide compound having high molecular compound dissolved therein. As utilizable high molecular compound, polyethylene, polypropylene, polyvinyl chloride, polyester resin, polyvinyl acetate, polyvinyl formal, polystyrene, polyvinyl butyral, polyurethane, MMA, ABS, SBR, "Neoprene", chlorinated rubber and the like may be enumerated. For the purpose of subjecting the copper film as heat treated to a solution of hydrocarbon halide compound having high molecular compound dissolved therein, a process of coating the solution, a process of spraying the solution, a process of dipping the film in the solution or the like may be employed. According to the embodiment under discussion, a film of high molecular compound is further formed on the surface of a copper film and the effect of inhibiting oxidation of a copper film and of preventing a time dependent change can be much more brought about.

Now several specific examples of the present invention in the case where a copper film is deposited by an electroless plating process will be described in the following.

EXAMPLE 1

A dielectric ceramic body of a titanium oxide system of 6.5 mm in diameter and 0.5 mm in thickness was dipped in an electroless copper plating solution, whereby a copper plated film was formed on the whole surface of the ceramic body. Then the same was placed in a container of a stainless steel basket and was subjected to a vapor of chloroform for one minute. Thereafter the surface of the copper film was naturally dried.

The dielectric ceramic body thus obtained as subjected in a chloroform vapor and that as not subjected were prepared and were placed in a natural atmosphere for 24 hours and then the surfaces of the copper films were observed. The body not processed in accordance with the present invention became brown and exhibited decreased solderability. On the other hand, the one processed in accordance with the present invention exhibited no change even after the same was left in a natural atmosphere for a month, with a maintained excellent solderability.

EXAMPLE 2

A dielectric ceramic body of a titanium oxide system of 6.5 mm in diameter and 0.5 mm in thickness was dipped in an electroless copper plating solution, whereby a copper plated film was formed on the whole surface of the ceramic body. Then the same was subjected to a heat treating process is an atmosphere of nitrogen at temperature of 700° C., and then was cooled. Thereafter the same was placed in the container of a stainless steel basket and was subjected to a vapor of trichloroethylene for one minute. Thereafter the surface of the copper film was naturally dried.

The dielectric ceramic body thus obtained as subjected to a trichloroethylene vapor and that as not subjected were prepared and were placed in natural atmosphere for 24 hours and then the surfaces of the copper films were observed. The body not processed in accordance with the present invention became brown and exhibited decreased solderability. However, that body processed in accordance with the present invention exhibited no change even after the same was left for a month, with a maintained excellent solderability.

EXAMPLE 3

A body of boundary layer type semiconductive ceramics of a strontium titanate system of 10.0 mm in diameter and 0.3 mm in thickness was prepared, and was dipped in an electroless copper plating solution, whereby a copper plated film was formed on the whole surface of the semiconductive ceramic body.

Then the same was subjected to a heat treating process in an atmosphere of nitrogen at temperature of 700° C. Continuously, the semiconductive dielectric body having a copper plated film formed thereon was dipped in a freon solution for about one minute.

The semiconductive ceramic body was taken out of the solution, and the copper plated film was naturally dried and stabilized.

Furthermore, the semiconductive ceramic body was forcedly oxidized under the condition of humidity of 95% and temperature of 40° C., and then the surface of the copper film was observed. The surface of the copper film exhibited no change in color even after the same was left for 5000 hours, with a maintained excellent solerability.

EXAMPLE 4

A dielectric ceramic body of a titanium oxide system of 6.5 mm in diameter and 0.5 mm in thickness was dipped in an electroless copper plating solution, whereby a copper plated film was formed on the whole surface of the ceramic body. Then the same was subjected to a heat treating process in an atmosphere of nitrogen at temperature of 700° C., and cooled. Thereafter the same was placed in a container of a stainless steel basket, the trichloroethylene with ester of polyethylene glycol dissolved therein was sprayed to the same. Thereafter the surface of the copper film was naturally dried.

The dielectric ceramic body thus obtained as subjected to a spraying process by trichloroethylene with a surface active agent dissolved therein and that as not subjected were prepared and were placed in a natural atmosphere for 24 hours, and then the surfaces of the copper films were observed. The body not processed in accordance with the present invention became brown and exhibited decreased solderability. However, that body processed in accordance with the present invention exhibited no change even after the same was left for a month, with a maintained excellent solderability.

EXAMPLE 5

A body of boundary layer type semiconductive ceramic of a strontium titanate system of 10.0 mm in diameter and 0.3 mm in thickness was prepared and was dipped in an electroless copper plating solution, whereby a copper plated film was formed on the whole surface of the semiconductive ceramic body.

Then the semiconductive ceramic body was subjected to a heat treating process in an atmosphere of nitrogen at temperature of 700° C. Continuously, the semiconductive ceramic body having the copper plated film formed thereon was dipped in a freon solution having a naphthenic acid soap dissolved therein for about one minute.

Then the semiconductive ceramic body was taken out of the solution, and was naturally dried and stabilized.

Furthermore, the semiconductive ceramic body was forcedly oxidized under the conditions of humidity of 95% and temperature of 40° C. The surface of the copper film exhibited no change in color even after the same was left for 5000 hours, with a maintained excellent solderability.

EXAMPLE 6

A dielectric ceramic body of a titanium oxide system of 6.5 mm in diameter and 0.5 mm in thickness was dipped in an electroless copper plating solution, whereby a copper plated film was formed on the whole surface of the ceramic body. Then the ceramic body was subjected to a heat treating process in an atmosphere of nitrogen at temperature of 700° C., and then the same was cooled. Thereafter the same was placed in a container of a stainless steel basket, and trichloroethylene having wax dissolved therein was sprayed to the same. Thereafter the surface of the copper film was naturally dried.

The dielectric ceramic body thus obtained as subjected to a spraying process by trichloroethylene having wax dissolved therein and that as not subjected were prepared and were placed in a natural atmosphere for 24 hours and then the surfaces of the copper films were observed. The body not processed in accordance with the present invention became brown and exhibited decreased solderability. However, that body processed in accordance with the present invention exhibited no change even after the same was left for a month, with a maintained excellent solderability.

EXAMPLE 7

A body of boundary layer type semiconductive ceramic of a strontium titanate system of 10.0 mm in diameter and 0.3 mm in thickness was prepared and was dipped in an electroless copper plating solution, whereby a copper plated film was formed on the whole surface of the ceramic body.

Then the semiconductive ceramic body was subjected to a heat treating process in an atmosphere of nitrogen at temperature of 700° C. Continuously, the semiconductive ceramic body having the copper plating film formed thereon is dipped in a freon solution with stearic acid dissolved therein for about one minute.

Then the semiconductive ceramic body was taken out of the solution, and then was naturally dried and the copper plating film was stabilized.

Furthermore, the semiconductive ceramic body was forcedly oxidized under the conditions of humidity of 95% and temperature of 40° C. The surface of the copper film exhibited no change in color even after the same was left for 5000 hours, with a maintained excellent solderability.

EXAMPLE 8

A ceramic body of dielectric of a titanium oxide system of 6.5 mm in diameter and 0.5 mm in thickness was dipped in an electroless copper plating solution, whereby a copper plated film was formed on the whole surface of the ceramic body. Then the ceramic body was subjected to a heat treating process in an atmosphere of nitrogen at temperature of 700° C., and then the same was cooled. Thereafter the same was placed in a container of a stainless steel basket, and a trichloroethylene solution with polyethylene dissolved therein was sprayed to the copper plated film. Thereafter the surface of the copper film was naturally dried.

The ceramic dielectric body thus obtained as subjected to a spraying process by employing a trichloroethylene solution with polyethylene dissolved therein and that as not subjected were prepared and were placed in a natural atmosphere for 24 hours and then the surfaces of the copper films were observed. The body not processed in accordance with the present invention became brown and exhibited decreased solderabily. However, that body processed in accordance with the present invention exhibited no change even after the same was left for a month, with a maintained excellent solderability.

EXAMPLE 9

A body of boundary layer type semiconductive ceramic of a strontium titanate system of 10.0. mm in diameter and 0.3 mm in thickness was prepared and was dipped in an electroless copper plating solution, whereby a copper plated film was formed on the whole surface of the ceramic body.

Then the semiconductive ceramic body was subjected to a heat treating process in an atmosphere of nitrogen at the temperature of 700° C. Continuously, the semiconductive ceramic body having the copper plated film formed thereon was dipped in a freon solution with polypropylene dissolved therein for about one minute.

Then the semiconductive ceramic body was taken out of the solution and was naturally dried, and the copper plated film was stabilized.

Furthermore, the semiconductive ceramic body was forcedly oxidized under the conditions of humidity of 95% and temperature of 40° C. The surface of the copper film exhibited no change in color even after the same was left for 5000 hours, with a maintained excellent solderability.

EXAMPLE 10

A dielectric ceramic body of a titanium oxide system of 6.5 mm in diameter and 0.5 mm in thickness was dipped in an electroless copper plating solution, whereby a copper plated film was formed on the whole surface of the ceramic body. Then the ceramic body was placed in a container of a stainless steel basket and a trichloroethylene solution with wax dissolved therein was sprayed to the copper plated film. Thereafter the surface of the copper film was naturally dried.

Thereafter the ceramic body was subjected to a heat treating process in an atmosphere of nitrogen at temperature of 700° C.

Continuously, a trichloroethylene solution with wax dissolved therein was sprayed to the ceramic body and the surface of the copper film was naturally dried.

The dielectric body thus obtained was left in a natural atmosphere. The copper film of the same exhibited no change even after a month, with a maintained excellent solderability.

EXAMPLE 11

A body of boundary layer type semiconductive ceramic of a strontium titanate system of 10.0. mm in diameter and 0.3 mm in thickness was prepared. The semiconductive ceramic body was placed at the anode of a diode DC sputtering apparatus, and a target of metal copper was placed at the cathode thereof. Then, after a high vacuum state was first attained in a bell jar of the apparatus, argon was injected into the bell jar until vacuum degree became $5 \times 10^{-2}$ to $5 \times 10^{-4}$ Torr, for example, $3 \times 10^{-3}$. Then a direct current voltage was applied between the cathode and the anode so that an electric power in a unit area of the target, for example, 6 W/cm$^2$ may be fed.

In this manner, a copper film was formed on the surface of the semiconductive ceramic body by a sputtering process. Thereafter the gas of freon was injected into the vacuum cell, and the surface of the copper film was subjected to the freon gas.

The semiconductive ceramic body thus obtained was left in a natural atmosphere. The same exhibited no change even after a month, with a maintained excellent solderability.

As is apparent from the foregoing examples, according to the present invention, after the surface of the copper film on the ceramic body having the copper film formed on the surface thereof is subjected to a hydrocarbon halide compound. As a result, an oxidizing phenomenon of the surface of the copper film is not observed and solderability is excellent, and thus the inventive method for inhibiting oxidization of a copper film is very useful, particularly in case where the copper film is subjected to a heat treating process.

In addition, although in the above described embodiment a copper film was formed by means of an electroless plating process or a sputtering process, the same effect can be attained by applying the present invention to a copper film formed by means of a vacuum evaporation process or ion plating process, of course.

Although in the foregoing the ceramic body was described as to a dielectric ceramic body or a boundary layer type semiconductive ceramic body, the same effect can be attained by applying the present invention to a copper film formed on an insulating ceramic body, a resistive ceramic body or other semiconductive ceramic body.

A method of manufacturing a ceramic capacitor by way of an example of a ceramic electric circuit component to which the inventive method may be applied will be described. The inventive method is applied to a part of the manufacturing process of the ceramic capacitor.

Referring to FIG. 1, a ceramic capacitor comprises a ceramic body 1 having, for example, a disk shaped appearance. The ceramic body 1 is provided on both major surfaces thereof with electrodes 2 which are opposing to each other. The electrodes 2 are formed of copper films. A lead wire 4 is connected to each electrode 2 by applying a solder 3, respectively. The lead wires 4 are led out in a radial directions. The assembly thus constituted is, as shown by a phantom line, molded with an insulating resin 5. Of course, the lead wires 4 are adapted such that at least the tip portions thereof may be exposed from the insulating resin 5.

Figure 4:
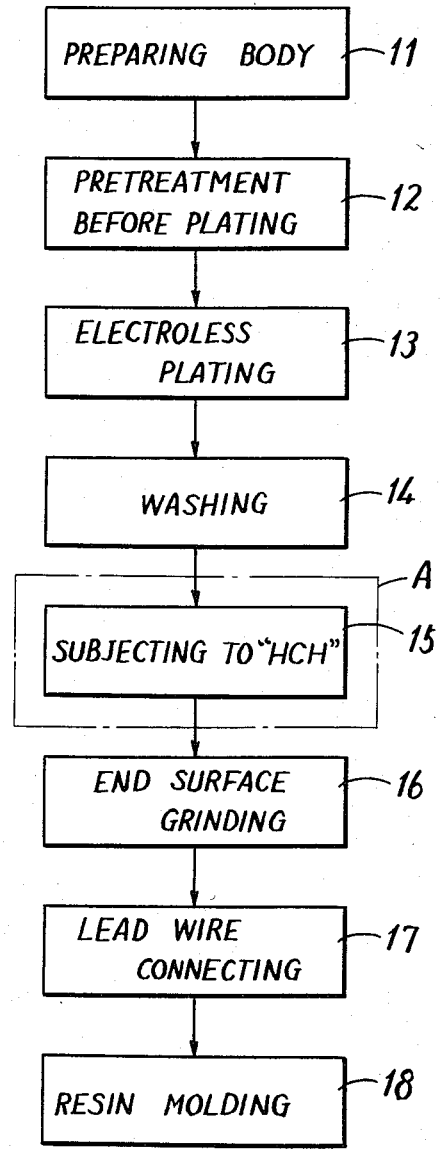
FIG. 4 is a flow diagram showing a manufacturing process of a ceramic capacitor in accordance with one embodiment of the present invention.

One example of the manufacturing process of the FIG. 1 ceramic capacitor is shown in FIG. 4. Referring to FIG. 4, as the first step 11, the ceramic body is prepared. As the second step 12, pretreatments before an electroless plating process are performed. The pretreatments comprise a rinse process, an activation process and a washing process. As the third step 13, the surface of the pretreated ceramic body is subjected to a copper electroless plating process, whereby a copper plated film is formed on the whole surface of the ceramic body. As the fourth step 14, the ceramic body having the copper film formed thereon is washed. As the fifth step 15, the copper film is subjected to a hydrocarbon halide compound. In the fifth step 15, various kinds of hydrocarbon halide compound or hydrocarbon halide compound solution described above can be used. Furthermore, various kinds of methods can be used as a method for subjecting to the hydrocarbon halide compound or the like.

Figure 2:
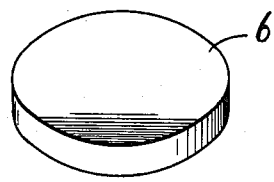
FIG. 2 is a perspective view of a ceramic body having a copper film formed on the whole surface thereof by means of an electroless plating process.
Figure 3:
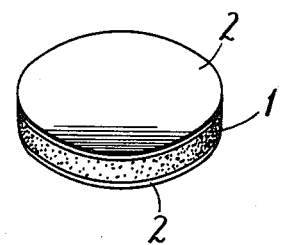
FIG. 3 is a prespective view of a ceramic capacitor body having the opposing electrode formed by grinding the end surface of the FIG. 2 ceramic body.

An intermediate shown in FIG. 2 is obtained after the step of the fifth step 15 is completed. More specifically, the intermediate has the copper film 6 formed on the whole surface of the ceramic body. The sixth step 16 is performed so that the copper film 6 formed on the whole surface of the intermediate may lead to opposing electrodes of a capacitor. FIG. 3 shows a state after finishing the sixth step 16. More specifically, in the sixth step 16, the outer peripheral end surface of the intermediate shown in FIG. 2 is ground and the ceramic body 1 is exposed in the end surface thereof. As a result, the copper film 6 formed on the whole surface of the ceramic body 1 becomes two electrodes 2 which are opposing to each other. The assembly shown in FIG. 3 corresponds to the ceramic body 1 and the opposing electrodes 2 shown in FIG. 1. Then the seventh step 17 and the eighth step 18 are carried out in order, whereby the ceramic capacitor shown in FIG. 1 is obtained.

Figure 5:
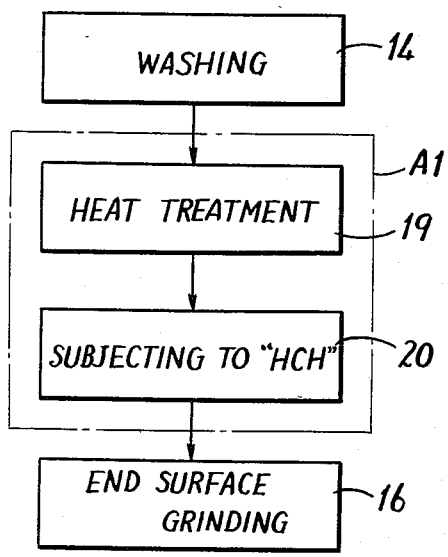
FIGS. 5 and 6 are flow diagrams showing manufacturing processes in accordance with other embodiments of the present invention, showing only modified portions as compared with the FIG. 4 process.
Figure 6:
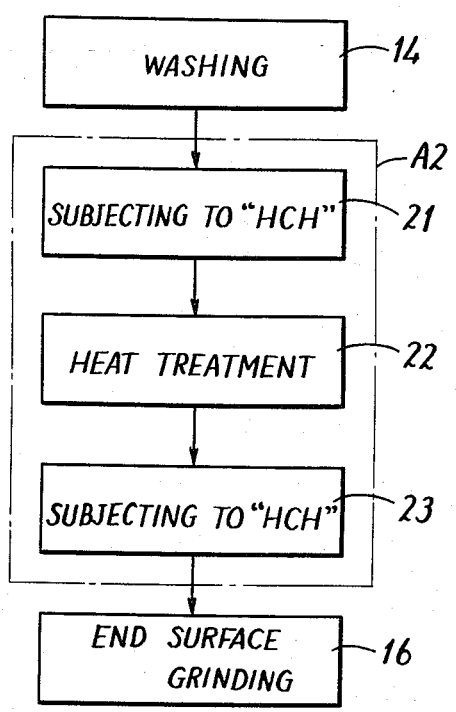

A part A of the manufacturing process of a ceramic capacitor which corresponds to the fifth step 15 shown in FIG. 4 can be substituted for a part A1 of a process shown in FIG. 5 or a part A2 of process shown in FIG. 6. In addition, in FIGS. 5 and 6, the steps correspond to the first step 11 to the third step 13 and the seventh step 17 and the eighth step 18 shown in the FIG. 4 flow diagram are omitted.

Referring to FIG. 5, a heat treatment step 19 is performed after a washing step 14. A step 20 for subjecting to a hydrocarbon halide compound is performed after the heat treatment step 19. In order to achieve the dense formation, metallization, enhancement of adhesiveness and stabilization for the copper plated film formed in the electroless plating step 13 shown in FIG. 4, the heat treatment step 19 is carried out. Generally, the heat treatment is performed in an inert atmosphere so that the copper film may not be reacted with oxygen. The following step 20 of subjecting to a hydrocarbon halide compound is more effective, particularly after the heat treatment step 20 described above. The reason is that a heat treated copper film is of more liability to be oxidized and of more liability to a time dependent characteristic change as compared with a copper film as not heat treated. As a result, the step 20 of subjecting to the hydrocarbon halide compound may enable the surface of the copper film as heat treated to be inhibited from oxidization and to the stabilized, may enable the copper film to be preserved for a long perod of time, and further may enable the same capacitor with the copper film formed thereon to achieve high reliability. The following steps are the same as that of FIG. 4.

Referring to FIG. 6, the step 21 of subjecting to a hydrocarbon halide compound is performed after the washing step 14. The process before the step 21 is similar to that shown in FIG. 4. Then the heat treatment step 22 is performed. The heat treament step 22 corresponds to the heat treatment step 19 shown in FIG. 5. After the heat treatment step 22, the step 23 of subjecting to the hydrocarbon halide compound is performed. The step of subjecting to the hydrocarbon halide compound has the same meaning as that of the corresponding step 20 in FIG. 5. The following steps are the same as the that of FIG. 4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process of inhibiting oxidation of a copper film formed by electroless plating, vacuum evaporation, sputtering or ion plating on a ceramic body, comprising the step of poisoning the catalytic activity of said copper film by temporarily subjecting the copper film formed on the surface of the ceramic body to an agent consisting of a hydrocarbon halide compound promptly after forming the copper film on the ceramic body, wherein the hydrocarbon halide is at least one member selected from the group consisting of trichloroethylene, perchloroethylene, freon, chlorobenzene, methyl chloride, methylene chloride, chloroform, and carbon tetrachloride, and removing said agent from said copper film, whereby said copper film has a measurably increased resistance to oxidation after removal of said agent, said increased resistance being a result of the action of said agent.

2. A process of inhibiting oxidation of a copper film formed on a ceramic body in accordance with claim 1, which further comprises the step of heat treating said copper film in an inert atmosphere before said step of subjecting said copper film to hydrocarbon halide compound.

3. A process of inhibiting oxidation of a copper film formed on a ceramic body in accordance with claim 1, which further comprises heat treating said copper film in an inert atmosphere before the step of subjecting said copper film to hydrocarbon halide compound, and heat treating said copper film in an inert atmosphere after the step of subjecting said copper film to hydrocarbon halide compound.

4. A process of inhibiting oxidation of a copper film formed on a ceramic body in accordance with claim 1, wherein said ceramic body comprises a member selected from the group consisting of dielectric, insulating, resistive and semiconductive material.

5. A process of inhibiting the oxidation of a copper film formed on a ceramic body in accordance with claim 1, wherein said hydrocabon halide compound is used in the form of a vapor.

6. A process of inhibiting the oxidation of a copper film formed on a ceramic body in accordance with claim 2, wherein said step of subjecting said copper film to hydrocarbon halide compound is effected within 30 minutes after said heat treatment.

7. A process of inhibiting oxidation of a copper film formed on a ceramic body in accordance with claim 1, wherein the ceramic body is a titanium oxide ceramic body having a copper film formed thereon by electroless plating and wherein the hydrocarbon halide is chloroform.

8. A process of forming an electrode of a ceramic capacitor, comprising the steps of
preparing a dielectric ceramic body having a surface,
forming a copper film serving as an electrode on said surface of said dielectric body by electroless plating, vacuum evaporation, sputtering or ion plating, and
poisoning the catalytic activity of said copper film by temporarily subjecting the copper film formed on the surface of the ceramic body to an agent consisting of a hydrocarbon halide compound promptly after the step of forming the copper film on the ceramic body, wherein said hydrocarbon halide is at least one member selected from the group consisting of trichloroethylene, perchloroethylene, freon, chlorobenzene, methyl chloride, methylene chloride, chloroform and carbon tetrachloride, and removing said agent from said copper film, whereby said copper film has a measurably increased resistance to oxidation after removal of said agent, said increased resistance being a result of the action of said agent.

* * * * *